United States Patent [19]

Lodahl

[11] Patent Number: 4,725,788
[45] Date of Patent: Feb. 16, 1988

[54] SWITCHING AMPLIFIER

[75] Inventor: Manfred Lodahl, Berlin, Fed. Rep. of Germany

[73] Assignee: Licentia Patent-Verwaltungs-GmbH, Frankfurt am Main, Fed. Rep. of Germany

[21] Appl. No.: 911,468

[22] Filed: Sep. 24, 1986

[30] Foreign Application Priority Data

Sep. 28, 1985 [DE] Fed. Rep. of Germany ....... 3534678

[51] Int. Cl.$^4$ .............................................. H03F 3/38
[52] U.S. Cl. ...................................... 330/10; 332/60; 455/108
[58] Field of Search ..................... 330/10, 202, 207 A, 330/251, 297; 332/59–62; 455/108

[56] References Cited

U.S. PATENT DOCUMENTS 4,560,944 12/1985 Furrer ................................... 330/10

FOREIGN PATENT DOCUMENTS

| 0025234A1 | 3/1981 | European Pat. Off. . |
| 0066904A1 | 12/1982 | European Pat. Off. . |
| 0083727A1 | 7/1983 | European Pat. Off. . |
| 1816530 | 6/1970 | Fed. Rep. of Germany . |
| 3044956A1 | 9/1981 | Fed. Rep. of Germany . |
| 2064901A | 6/1981 | United Kingdom . |

Primary Examiner—James B. Mullins
Attorney, Agent, or Firm—Spencer & Frank

[57] ABSTRACT

A switching amplifier, in particular for generating a modulated anode voltage for a high-frequency, high-power AM transmitter, includes a number of switchable voltage sources. The switchable voltage sources in a first portion of the amplifier provide small-scale gradations, which can be combined in any sequence. The switchable voltage sources in a second portion of the amplifier provide large voltage leaps of constant magnitude, which are combined in sequence.

19 Claims, 5 Drawing Figures 4,725,788

SWITCHING AMPLIFIER

BACKGROUND OF THE INVENTION

The present invention is directed to a switching amplifier of the type having a sequence of voltage sources which are switched in response to a low frequency input signal, and more particularly to a switching amplifier for generating a low-frequency modulated anode voltage for a high-frequency, high-power AM transmitter, which, e.g., has an output of approximately 600 kW.

German Offenlegungsschrift [patent application laid open without examination] No. 1,816,530 is directed to a switching amplifier in which an output voltage is controlled in response to an analogous input signal. In this power amplifier several voltage sources are connected in sequence such that a specific voltage source is allocated to each voltage range.

In order to obtain a highly linear output signal one must either use a substantial number of voltage sources, which are then merely switched ON or OFF, or a few voltage sources whose respective output voltages are analogously controlled in a certain range. Grid-controlled tubes and/or transistors can be used as controlling elements.

The disadvantage of such an arrangement is that it can only be used as an alternating voltage amplifier of little power for a frequency range of 40 Hz to 4 kHz. In addition, small-scale gradation of the output voltage in a cost-effective manner (e.g., in a binary manner or by means of pulse width modulation) is not possible, since the voltage sources are always sequentially switched ON or OFF corresponding to the magnitude of the control signal, which, disadvantageously, is of the same magnitude.

From the German Offenlegungsschrift No. 3,044,956 as well as the European patent application No. 66,904 A1, switching amplifiers which avoid the disadvantages mentioned above are known. However these amplifiers have the disadvantage of producing a capacitive load on the output voltage, which is caused by transformer coils associated with the voltage sources.

SUMMARY OF THE INVENTION

The object of the present invention is to provide an improved generic switching amplifier which generates a highly linear output signal in a cost-effective manner, and which employs voltage sources that can be reliably connected by semiconductor elements.

This and other objects which will become apparent can be achieved by a switching amplifier which employs a plurality of first voltage sources which are selectably connected to a second plurality of voltage sources which are connected to a load, such as the anode of a transmitter tube. First switch elements which are controlled by a low frequency input signal are connected to the first voltage sources in an alternating manner to form a series of pairs, each pair having a first voltage source and a first switch element. The amplifier also includes a plurality of first rectifying means, such as diodes, which are connected in series, with each first rectifying means corresponding to a respective one of the source/element pairs. The amplifier additionally includes a plurality of current limiters, each of which corresponds to a respective pair and is connected between that pair and the corresponding first rectifying means. The second voltage sources are connected in series, and corresponding to each of the second voltage sources is a respective second switch element which is controlled by the input signal. The second switch elements are connected in series. The amplifier additionally includes a plurality of second rectifying means, such as diode combinations, each corresponding to a respective second voltage source and being connected between that source and the corresponding switch element.

One advantage of such an amplifier is that the voltage sources are merely switched ON or OFF, with the switch elements being triggered by digital control signals.

Another advantage is that the voltage of a multitude of the voltage sources can be determined on the basis of the maximum allowable voltage for semiconductor switches, instead of being selected to achieve optimal linearity. Nevertheless, there is a small-scale gradation of the output voltage, so that a high degree of linearity can be achieved.

DESCRIPTION OF THE PREFERRED EMBODIMENTS

Figure 1:
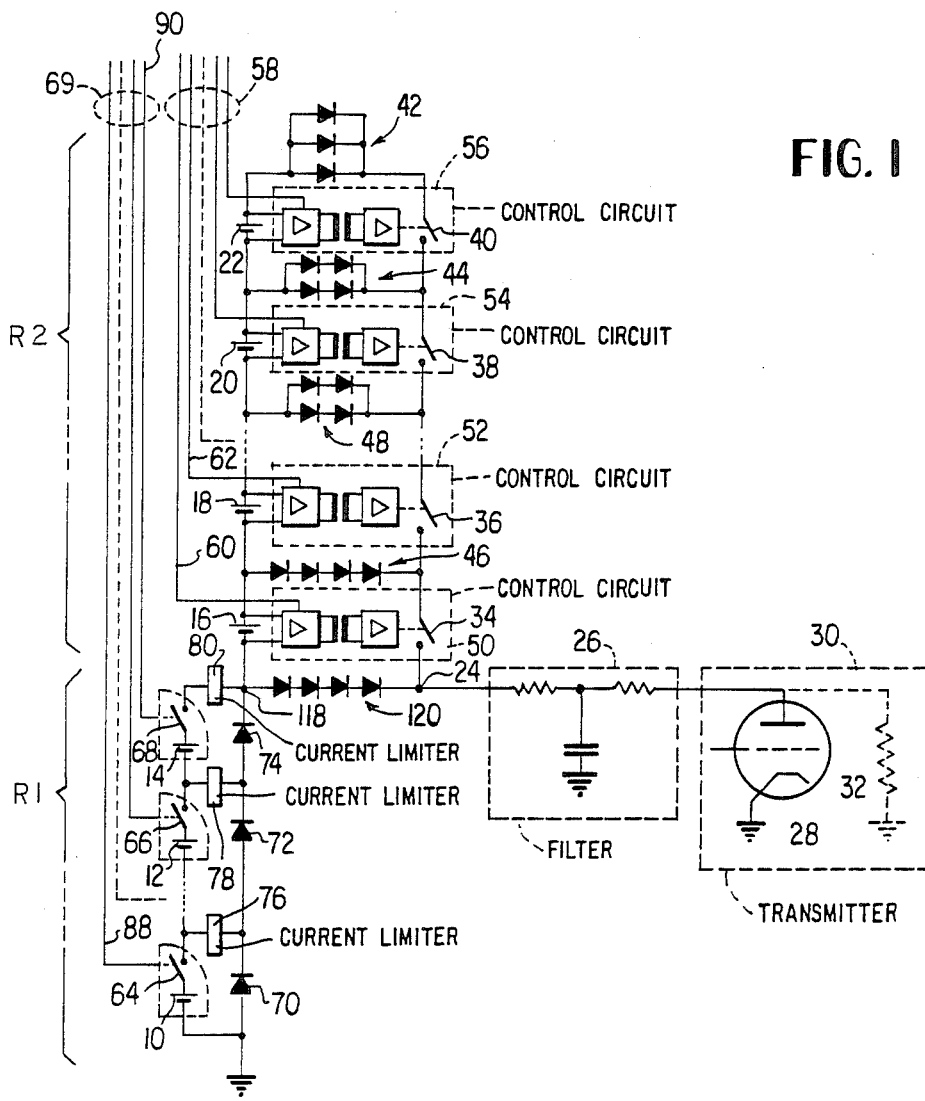
FIG. 1 is a schematic diagram illustrating a switching amplifier in accordance with the present invention.

In FIG. 1, the switching amplifier of the present invention includes a first portion R1 having first voltage sources 10, 12, and 14 and a second portion R2 having second voltage sources 16, 18, 20, and 22. As will be apparent from the dotted lines, which represent repetitive circuitry, additional first and second voltage sources are also present. At the output terminal 24 an output signal of a maximum amplitude of, e.g., 30 kV at a current of approximately 100 A is generated. This output signal is smoothed by a low-pass filter 26 and led to the anode of a high-level tube 28 in a high frequency, high-power transmitter 30. For purposes of subsequent discussion the load presented by tube 28 is depicted in dotted lines as a load resistor 32.

Portion R2 contains, e.g., fifty second voltage sources (although only sources 16, 18, 20, and 22 are illustrated) which can be connected in sequence and which each generate basically equal direct voltages of approximately 640 V each. These second voltage sources can be switched ON and OFF only sequentially by a serial connection of semiconductor switches (of which only switches 34, 36, 38, and 40 are illustrated), each of which has an admissible peak voltage rating of approximately 1.2 kV. Between each of the second voltage sources and its corresponding switch is a link circuit containing semiconductor diodes connected in series and/or in paralle which have the effect of freewheeling diodes.

For example, a link circuit in the form of diode combination 42 is connected between second voltage source 22 and its corresponding switch 40; diode combination 44 is connected between second voltage source 20 and its corresponding switch 38; and diode combination 46 is connected between second voltage source 16 and its corresponding switch 34. It will be apparent that the dotted section of portion R2 includes, inter alia, a second voltage source (not illustrated) and switch (not illustrated) that are connected by diode array 48, and a diode array (not illustrated) which connects second voltage source 18 to its corresponding switch 36. The switches 34-40 are parts of control circuits 50-56, which are individually supplied with electric energy by means of the corresponding voltage sources. Control circuit 56, for example, receives power for operation from voltage source 22. Although not illustrated in detail, the control circuits 50-56 contain the necessary circuit amplifiers as well as the necessary circuits, e.g., transformers, for voltage isolation. The control circuits are triggered e.g. by light pulses received from optical cable 58, which comprises an optical fiber for each control circuit. Fiber 60 conveys light to control circuit 50, which closes switch 34 when light is received; fiber 62 conveys light to control circuit 52, which closes switch 36 when light is received, etc. The method of operation of portion R2 is analogous in principle to that of the previously-mentioned German Offenlegungsschrift No. 1,816,530 with the difference, however, that only digital control signals are necessary.

With continuing reference to FIG. 1, the first portion R1 of the switching amplifier is connected to second portion R2 at terminal 118, which is connected via diode array 120 to terminal 24. One end of portion R1 is preferably grounded if one connection of the load resistor 32 is also grounded.

Each of the first voltage sources of portion R1 is connected to an associated switch element to form a pair (that is, voltage source and the corresponding switch element), the pairs being connected in series. In FIG. 1 switch element 64 forms a pair with first voltage source 10, switch element 66 forms a pair with first voltage source 12, and switch element 68 forms a pair with first voltage source 14. The switch elements are controlled by digital electrical signals which are received via conductors in cable 69. The first voltage sources of portion R1 permit small-scale gradation of the output voltage and thus generate output voltages which are, for example, binary weighted, and can be added independently of one another. This is made possible by a diode cascade which includes a diode corresponding to each first voltage source. Diodes 70 (corresponding to source 10), 72 (corresponding to source 12), and 74 (corresponding to source 14) are shown. Current limiters (of which current limiters 76, 78 and 80 are shown) are placed in the link circuits between the voltage source-switch element pairs and the corresponding diodes of the diode cascade. These current limiters limit the peak currents, especially the so-called commutation currents, which originate during the switching process, and thus have the advantage of permitting a much higher load capacity of the first voltage sources. The number of first voltage sources, as well as the output voltage each generates, are dependent on the desired linearity of the output voltage. The first voltage source 10 generates a voltage of approximately 10 V, while the first voltage source 14 generates a voltage of 320 V. The other first voltage sources generate binary weighted intermediate voltages. For example, since source 12 is next to source 14, source 12 generates 160 V.

Figure 2:
FIG. 2 schematically illustrates a current limiter which can be used in the circuit of FIG. 1.
Figure 4:
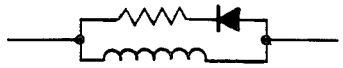
FIG. 4 schematically illustrates a further current limiter which can be used in the circuit of FIG. 1.
Figure 3:
FIG. 3 schematically illustrates another current limiter which can be used in the circuit of FIG. 1.

FIGS. 2 to 4 show examples of the current limiters (e.g., 76, 78, and 80). Each current limiter may be an ohmic resistance (FIG. 2), a parallel connection of an ohmic resistance with an inductor (FIG. 3), or a parallel connection of an inductor to a serial connection of an ohmic resistance and a diode (FIG. 4).

Figure 5:
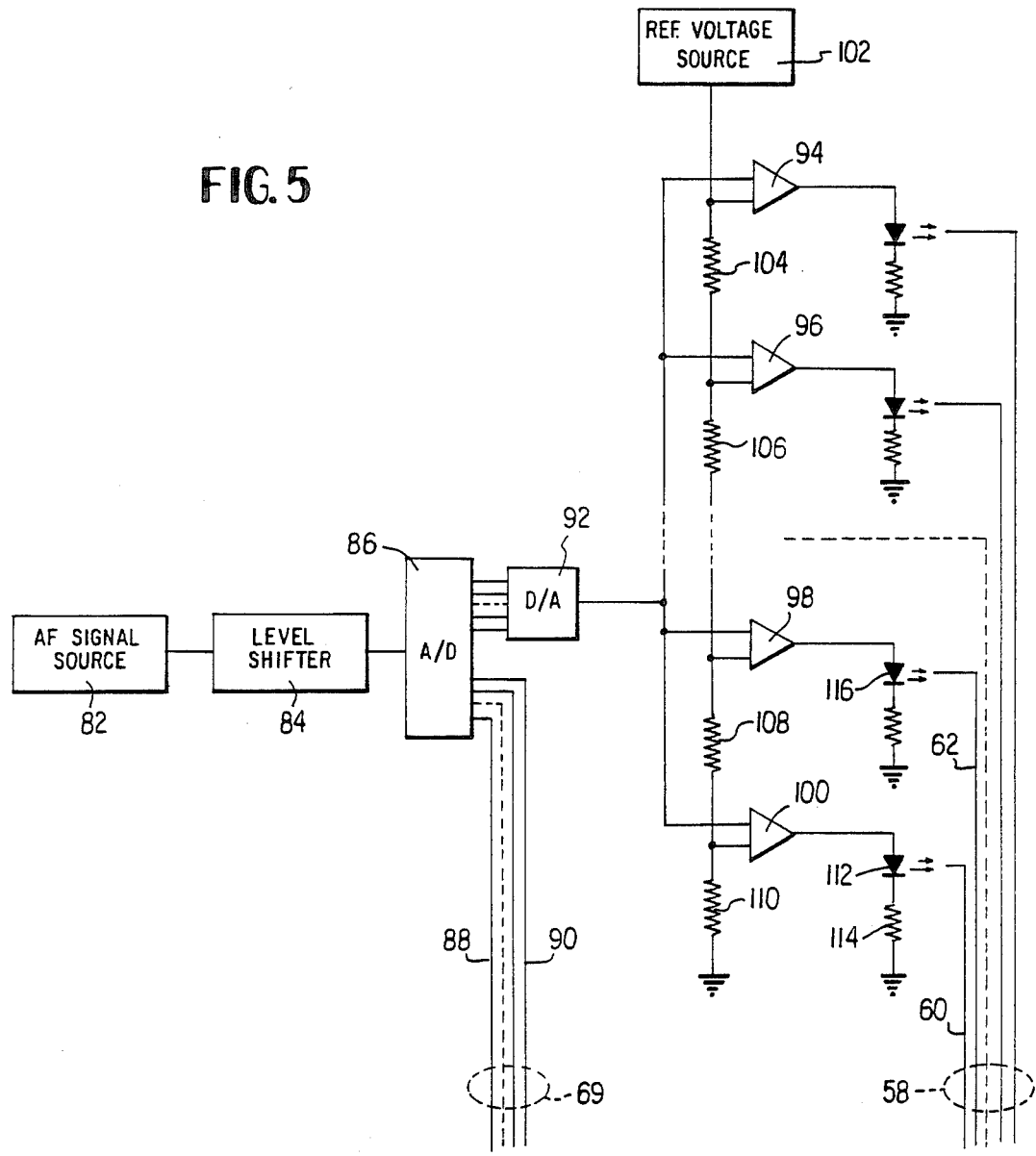
FIG. 5 is a schematic block diagram illustrating circuitry for controlling the switch elements of FIG. 1 in response to an audio frequency input signal.

FIG. 5 illustrates an example of a circuit which may be used for controlling the switch elements in FIG. 1. An audio frequency signal source 82 is connected to a level shifter 84, which raises the audio signal with respect to ground so that there are no zero crossings. The output of shifter 84 is thus non-negative, and is applied as an input to analog-to-digital converter 86. The least significant bits of the output of converter 86 are conveyed via cable 69 to portion R1 in FIG. 1. The bit on conductor 88 controls switch element 64 (FIG. 1), the bit on conductor 90 controls switch element 68 (FIG. 1), and intermediate switch elements of portion R1 are controlled by corresponding intermediate bits. The most significant bits of the output of converter 86 are conveyed to a digital-to-analog converter 92, the output of which is applied to an input terminal of each of comparators 94-100 (and additional comparators, not illustrated, as indicated by the dotted lines). A DC source 102 provides a reference voltage which is divided by equal-valued resistors 104-110 (etc.) to provide evenly spaced voltages for the reference inputs of comparators 94-100. If the value of the analog output from converter 92 exceeds the voltage drop across resistor 110, comparator 100 turns ON. Light emitting diode 112 and current limiting resistor 114 are connected to the output of comparator 100, so that LED 112 turns ON and emits light into fiber 60 when the output of converter 92 exceeds the voltage drop across resistor 110. When the output exceeds the voltage drop across both resistors 110 and 108, LED 116 also turns ON and emits light to the end of fiber 62. It will be apparent that additional LEDs turn ON as the output of converter 92 increases, and that the LEDs turn ON in sequence from LED 112 toward the top of FIG. 5. It is further possible to substitute a binary to decimal converter for the shown D/A-converter 92 and the following arrangement of comparators 94 to 100.

Referring next to FIGS. 1 and 5, the operation of the switching amplifier will now be briefly summarized. With six first voltage sources (10 V, 20 V, 40 V, 80 V, 160 V, and 320 V) and associated switch elements, diodes, and current limiters, it will be apparent that portion R1 can generate voltages of up to 630 volts at terminal 118, depending upon the digital signal conveyed by cable 69. For purposes of illustration assume that switch elements 64 and 68 are closed, and that the remaining switch elements in portion R1 are open. In this situation diodes 70 and 74 would be reverse-biassed and the remaining diodes of the cascade in portion R1 (e.g., diode 72) would be forward-biassed. Neglecting voltage drops across current limiters 76 and 80, a 10 volt drop across diode 70 would be in series with a 320 volt drop across diode 74 to provide a potential at terminal 118 of 330 V. Unless diode array 120 is reverse-biassed, substantially this same voltage would appear at terminal 24.

Since the second voltage sources (e.g., 16-22) are each approximately 640 V, diode array 120 will be reverse-biassed if switch 34 is closed, in which case the potential at terminal 24 is the sum of the potential at terminal 118 and the voltage across diode array 120. Switch 34 is closed when an optical signal is received on fiber 60, whereupon diode array 46 becomes forward-biassed and, neglecting a minor voltage drop across array 46, the 640 volts of first voltage source 16 appears across array 120. If switch 36 is then closed, too, the diode array (not illustrated) corresponding to source 18 and switch 36 becomes forward-biassed, thereby causing array 46 to become reversed-biassed. The result is that substantially the sum of first voltage sources 16 and 18 appears across diode array 120. In this way closure of the first switch elements in portion R1 controls the voltage at terminal 24 in a binary manner and closure of the second switch elements in portion R2 controls the voltage at terminal 24 in an additive manner. It will be apparent that the voltage at terminal 24 is controllable in 10 volt increments from 0 volts to the sum of the voltages of all of the first and second voltage sources.

The present disclosure relates to the subject matter disclosed in Federal Republic of Germany application P No. 35 34 678.7, filed Sept. 28th, 1985, the entire specification of which is incorporated herein by reference.

It will be understood that the above description of the present invention is susceptible to various modifications, changes, and adaptations, including various serial and/or parallel combinations of semiconductor switch elements, and the same are intended to be comprehended within the meaning and range of equivalents of the appended claims.

What I claim is:

1. A switching amplifier for driving a load in response to a low frequency input signal, comprising:
   a plurality of first voltage sources;
   first means responsive to said input signal for selectively connecting said first voltage sources to said load, said first means including
      a plurality of first switch elements which are controlled by said input signal, said first switch elements and first voltage sources being connected in a series of pairs, each pair of the series having a respective first voltage source and a respective first switch element that is connected to the respective first voltage source,
      a plurality of first rectifying means connected in series, each first rectifying means corresponding to a respective pair, and
      a plurality of current limiters, each current limiter corresponding to a respective pair and being connected between the respective pair and the corresponding first rectifying means;
   a pluralilty of second voltage sources connected in series, the series of second voltage sources being connected to the first means; and
   second means responsive to the input signal for selectively connecting said second voltage sources to said load, said second means including
      a plurality of second switch elements which are controlled by said input signal, said second switch elements being connected in series, each second switch element corresponding to a respective second voltage source, and
      a plurality of second rectifying means, each second rectifying means corresponding to a respective second voltage source and being connected between the respective second voltage source and the corresponding second switch element.

2. The amplifier of claim 1, wherein the series of first rectifying means is connected to said load.

3. The amplifier of claim 1, wherein the series of first rectifying means is connected to ground and the load is connected to ground.

4. The amplifier of claim 1, wherein each current limiter comprises a respective resistor.

5. The amplifier of claim 1, wherein each current limiter comprises a respective resistor and a respective inductor connected in parallel with the respective resistor.

6. The amplifier of claim 1, wherein each current limiter comprises a respective resistor, a respective diode in series with the respective resistor, and a respective inductor connected in parallel with the resistor-diode series.

7. The amplifier of claim 1, wherein the voltages of said first voltage sources are different from each other, and wherein the sum of the voltages of the first voltage sources is about equal to the voltage of a single second voltage source.

8. The amplifier of claim 1, wherein said second means further comprises a plurality of control circuit means, responsive to said input signal, for opening and closing said second switch elements.

9. The amplifier of claim 1, further comprising means responsive to said input signal for selectively opening and closing said first switch elements in any order and for selectively opening and closing said second switch elements in sequence.

10. The amplifier of claim 1, wherein the load is a tube in a high frequency, high power AM transmitter, said tube having an anode, and further comprising a low-pass filter connecting said series of second switch elements to said anode.

11. The amplifier of claim 1, wherein said first rectifying means comprise diodes, and said second rectifying means comprise diode arrays.

12. A switching amplifier for driving a load having first and second terminals in response to an audio frequency input signal, comprising:
   diode means, having first and second terminals, for rectifying electricity;
   means for electrically connecting said second terminal of said diode means to said first terminal of said load;
   a plurality of first voltage sources;
   first means responsive to said input signal for selectively connecting said first voltage sources to said first terminal of said diode means, said first means including
      a plurality of first switch elements which are controlled by said input signal, said first switch elements and first voltage sources being connected in a series of pairs, each pair of the series having a respective first voltage source and a respective first switch element that is connected to the respective first voltage source,
      a plurality of first rectifying means connected in series between said second terminal of said load and said first terminal of said diode means, each first rectifying means corresponding to a respective pair, and
      a plurality of current limiters, each current limiter corresponding to a respective pair and being connected between the respective pair and the corresponding first rectifying means;
   a pluralilty of second voltage sources connected in series, the series of second voltage sources being connected to said first terminal of said diode means; and
   second means responsive to the input signal for selectively connecting said second voltage sources acros said second terminal of said diode means, said second means including a plurality of second switch elements which are controlled by said input signal, said second switch elements being connected in series to said second terminal of said diode means, each second switch element corresponding to a respective second voltage source, and a plurality of second rectifying means, each second rectifying means corresponding to a respective second voltage source and being connected between the respective second voltage source and the corresponding second switch element.

13. The switching amplifier of claim 12, wherein said second terminal of said load is grounded.

14. The amplifier of claim 13, wherein each current limiter comprises a respective resistor.

15. The amplifier of claim 13, wherein each current limiter comprises a respective resistor and a respective inductor connected in parallel with the respective resistor.

16. The amplifier of claim 13, wherein each current limiter comprises a respective resistor, a respective diode in series with the respective resistor, and a respective inductor connected in parallel with the resistor-diode series.

17. The amplifier of claim 13, wherein the load is a tube in a high frequency, high power AM transmitter, said tube having an anode, and wherein said means for electrically connecting comprises a low-pass filter connecting said second terminal of said diode means to said anode.

18. The amplifier of claim 12, wherein the voltages of said first voltage sources are different from each other, the voltage of each first voltage source being proportional to two raised to a respective integer, and wherein all of the second voltage sources have substantially the same voltage, the sum of the voltages of the first voltage sources is about equal to the voltage of a single second voltage source.

19. The amplifier of claim 18, further comprising means responsive to said input signal for selectively opening and closing said first switch elements in any order and for selectively opening and closing said second switch elements in sequence.

* * * * *